United States Patent [19]

Van Ryswyk

[11] Patent Number: 5,831,826
[45] Date of Patent: Nov. 3, 1998

[54] HEAT TRANSFER APPARATUS SUITABLE FOR USE IN A CIRCUIT BOARD ASSEMBLY

[75] Inventor: James Edward Van Ryswyk, Grayslake, Ill.

[73] Assignee: Motorola, Inc., Schaumburg, Ill.

[21] Appl. No.: 717,055

[22] Filed: Sep. 20, 1996

[51] Int. Cl.$^6$ ..................................................... H05K 7/20
[52] U.S. Cl. ........................ 361/719; 361/704; 361/709; 361/720; 361/753; 165/80.1; 165/185; 174/16.3; 174/51; 257/717; 379/428; 379/429
[58] Field of Search ..................................... 361/704, 707, 361/709, 719, 720, 753; 165/185, 80.1; 174/16.3, 51; 257/717; 379/428, 429

[56] References Cited

U.S. PATENT DOCUMENTS

| | | |
|---|---|---|
| 4,504,886 | 3/1985 | Cygan et al. . |
| 4,998,803 | 3/1991 | Salour et al. . |
| 5,014,904 | 5/1991 | Morton ................................. 165/80.04 |
| 5,045,971 | 9/1991 | Ono et al. . |
| 5,086,509 | 2/1992 | Inbushi et al. ........................... 361/704 |
| 5,285,352 | 2/1994 | Pastore et al. ........................... 361/707 |
| 5,353,192 | 10/1994 | Nordin . |
| 5,373,101 | 12/1994 | Barabolak . |
| 5,375,039 | 12/1994 | Wiesa . |
| 5,379,185 | 1/1995 | Griffin et al. . |
| 5,394,301 | 2/1995 | Fassel et al. . |
| 5,459,640 | 10/1995 | Moutrie et al. . |
| 5,467,251 | 11/1995 | Katchmar . |
| 5,508,885 | 4/1996 | Ishimoto . |
| 5,583,377 | 12/1996 | Higgins, III ............................. 361/707 |
| 5,642,261 | 6/1997 | Bond et al. ............................. 361/704 |
| 5,646,373 | 7/1997 | Collins et al. .......................... 361/719 |

FOREIGN PATENT DOCUMENTS

| | | |
|---|---|---|
| 2-249299 | 10/1990 | Japan . |
| 2137422 | 10/1984 | United Kingdom . |

OTHER PUBLICATIONS

Photograph of a power amplifier module and associated ground pad employed in a 3W transceiver module manufactured and sold by Motorola, Inc on Jan. 22, 1987 as part of a mobile cellular telephone.

*Primary Examiner*—Leo P. Picard
*Assistant Examiner*—Boris L. Chervinsky
*Attorney, Agent, or Firm*—Mark D. Patrick

[57] ABSTRACT

A heat transfer apparatus is carried on a substrate (204) having top and bottom surfaces (212, 214). The heat transfer apparatus includes a pad (220/222), at least one via (224/226), and a plurality of pads (302). The pad (220/222) is carried on the top surface (212) of the substrate (204) to electrically connect to an electronic component (228/230). The via (224/226) intersects the pad (220/222) and extends between the top and bottom surfaces (212, 214) of the substrate (204). The plurality of pads (302) are carried on the bottom surface (214) of the substrate (204) beneath the pad (220/222). The via (224/226) intersects one of the plurality of pads (302) to transfer heat generated during operation of the electronic component (228/230) thereto.

18 Claims, 4 Drawing Sheets

HEAT TRANSFER APPARATUS SUITABLE FOR USE IN A CIRCUIT BOARD ASSEMBLY

FIELD OF THE INVENTION

This invention relates generally to circuit board assemblies and, more specifically, to a heat transfer apparatus suitable for use in a circuit board assembly.

BACKGROUND OF THE INVENTION

A byproduct of normal operation of an electronic circuit is thermal energy, i.e., heat. Thermal energy is generated as a result of frictional effects of charge flow during operation of the electronic circuit. Greater charge flows, i.e., larger currents, generate a greater buildup of thermal energy. If not properly dissipated, a buildup of thermal energy can cause undesirable operating characteristics in the electronic circuit, and can even cause damage to the components of the electronic circuit, as well as components of other proximate circuits.

Generation of thermal energy is particularly significant in amplification devices such as, for example, a power amplifier. Because power amplifiers often amplify the input signals supplied thereto, signals output by the power amplifier can be many times the amplitude of the input signals. However, the efficiency of a typical power amplifier is only about 40% and therefore, about 60% of the input electrical energy supplied to these amplifiers is converted into thermal energy. It is necessary to dissipate this thermal energy by thermally coupling the power amplifier to a heat sinking element. Due to the large amount of thermal energy generated by the operation of these power amplifiers, heat dissipation can be readily accomplished by using a metal housing, which houses the substrate on which the power amplifier is mounted, as a heat sinking element. By creating a thermally conductive path between the power amplifier and the metal housing, thermal energy contained in, or generated during the operation of, the power amplifier can be conducted to the metal housing and dissipated by convection.

Existing power amplifiers circuits, especially those for use in 3 W applications, are typically packaged in modules comprising a large metallic flange. To dissipate the heat generated by these power amplifier circuits, the module is mounted to the circuit board so that the metallic flange physically contacts the metal housing. One method of accomplishing this is disclosed in U.S. Pat. No. 5,459,640 by Moutrie et al., entitled "Electrical Module Mounting Apparatus and Method thereof", issued on Oct. 17, 1995, and assigned to Motorola, Inc. In Moutrie et al., the module is mounted on a circuit board over a breakaway area, which is later removed to permit direct seating of the metallic flange to the housing for dissipation. Unfortunately, such a technique can not be employed with power amplifier circuitry that is surface mounted on a circuit board.

Therefore, a need exists for an apparatus capable of transferring heat generated by electronic components that are surface mounted on a permanent portion of a circuit board to a metal housing for dissipation.

DETAILED DESCRIPTION OF THE PREFERRED EMBODIMENTS

A heat transfer apparatus is disposed on a substrate, such as a printed circuit board, having top and bottom surfaces. The heat transfer apparatus comprises a component pad carried on the top surface of the substrate, at least one via extending between the top and bottom surfaces of the substrate, and a plurality of pads carried on the bottom surface of the substrate beneath the component pad. The component pad electrically connects to an electronic component. The via intersects the component pad and one of the plurality of pads to transfer heat generated during operation of the electronic component to the plurality of pads. Unlike existing assemblies employing breakaway areas, this integrated heat transfer apparatus permits surface mounted assembly of a high heat generating electronic component on a permanent portion of a circuit board. In addition, the integrated heat transfer apparatus provides a reliable ground connection to ensure consistent operation of the electronic component. Also, this integrated heat transfer apparatus allows internal conductors or traces of the circuit board to be routed beneath the area occupied by the high heat generating electronic component or circuit. In the existing assemblies, all traces must be routed around the breakaway or cutaway area, often resulting in an increase in the size of the circuit board.

Figure 1:
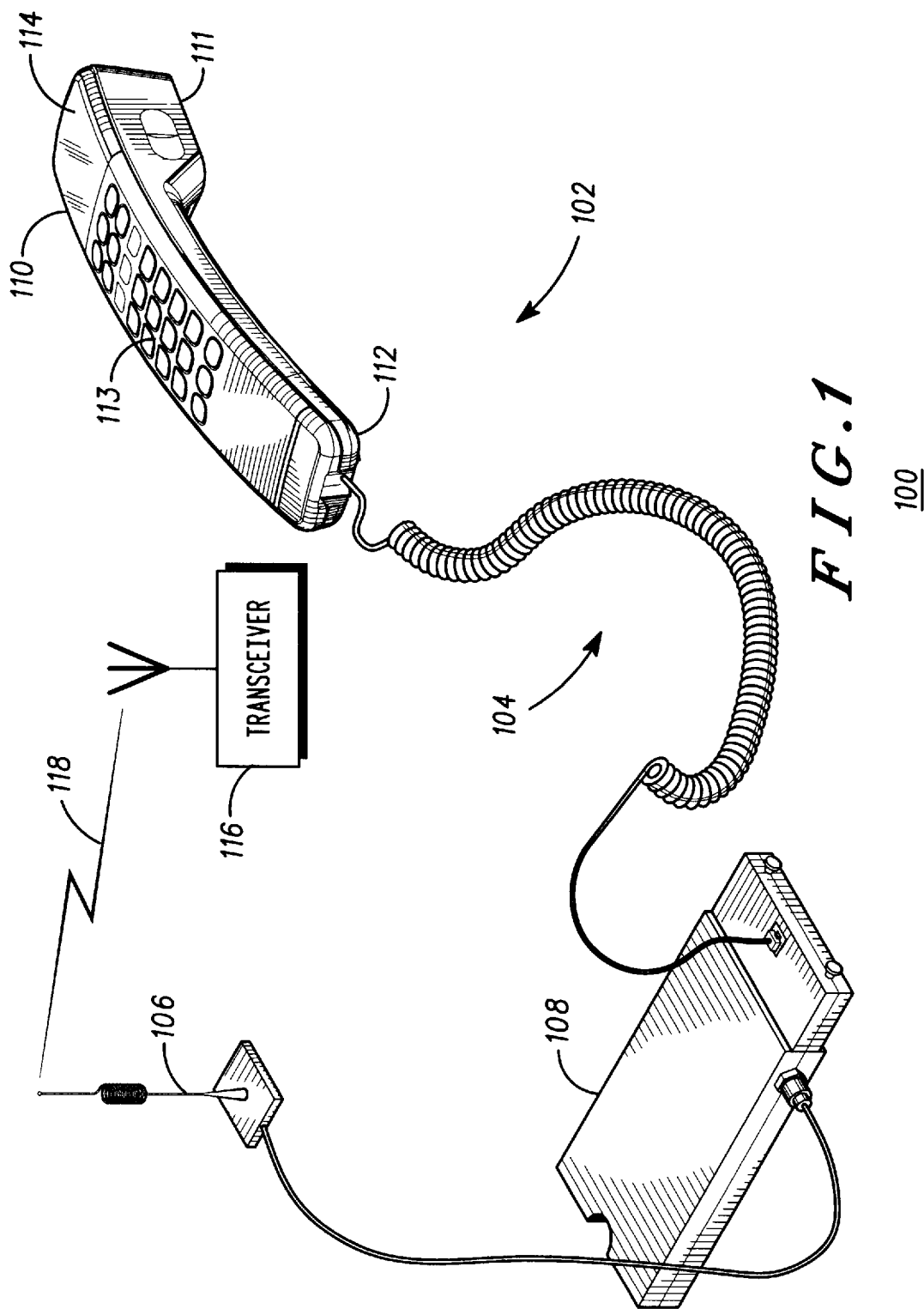
FIG. 1 illustrates a radio communication system including a transceiver employing a circuit board assembly.

A radio communication system 100 (FIG. 1) includes an electronic device, specifically a mobile radiotelephone 102. The mobile radiotelephone 102 includes a user interface 104, an antenna 106, and a transceiver 108 coupled to the user interface 104 and the antenna 106. The user interface 104 consists primarily of a handset 110 having a speaker 111, a microphone 112, a keypad 113, and a display 114. The mobile radiotelephone 102 communicates with a remote transceiver 116 via radio frequency (RF) signals 118. The remote transceiver 116 transmits the RF signals 118 into a radio coverage area populated by the mobile radiotelephone 102. The antenna 106 transduces the RF signals 118 into electrical RF receive signals and couples the electrical RF receive signals to the transceiver 108. The transceiver 108 converts the electrical RF receive signals into data receive signals, which are output as audible speech and operational information via the speaker 111 and the display 114 of the user interface 104, respectively. Speech and data input via the keypad 113 and the microphone 112 of the user interface 104, respectively, are coupled to the transceiver 108 as data transmit signals. The transceiver 108 converts the data transmit signals into electrical RF transmit signals. The transceiver 108 includes a power amplifier that amplifies the electrical RF transmit signals. The transceiver 108 couples the amplified electrical RP transmit signals to the antenna 106 for transduction and transmission to the remote transceiver 116 as the RF signals 118.

Figure 2:
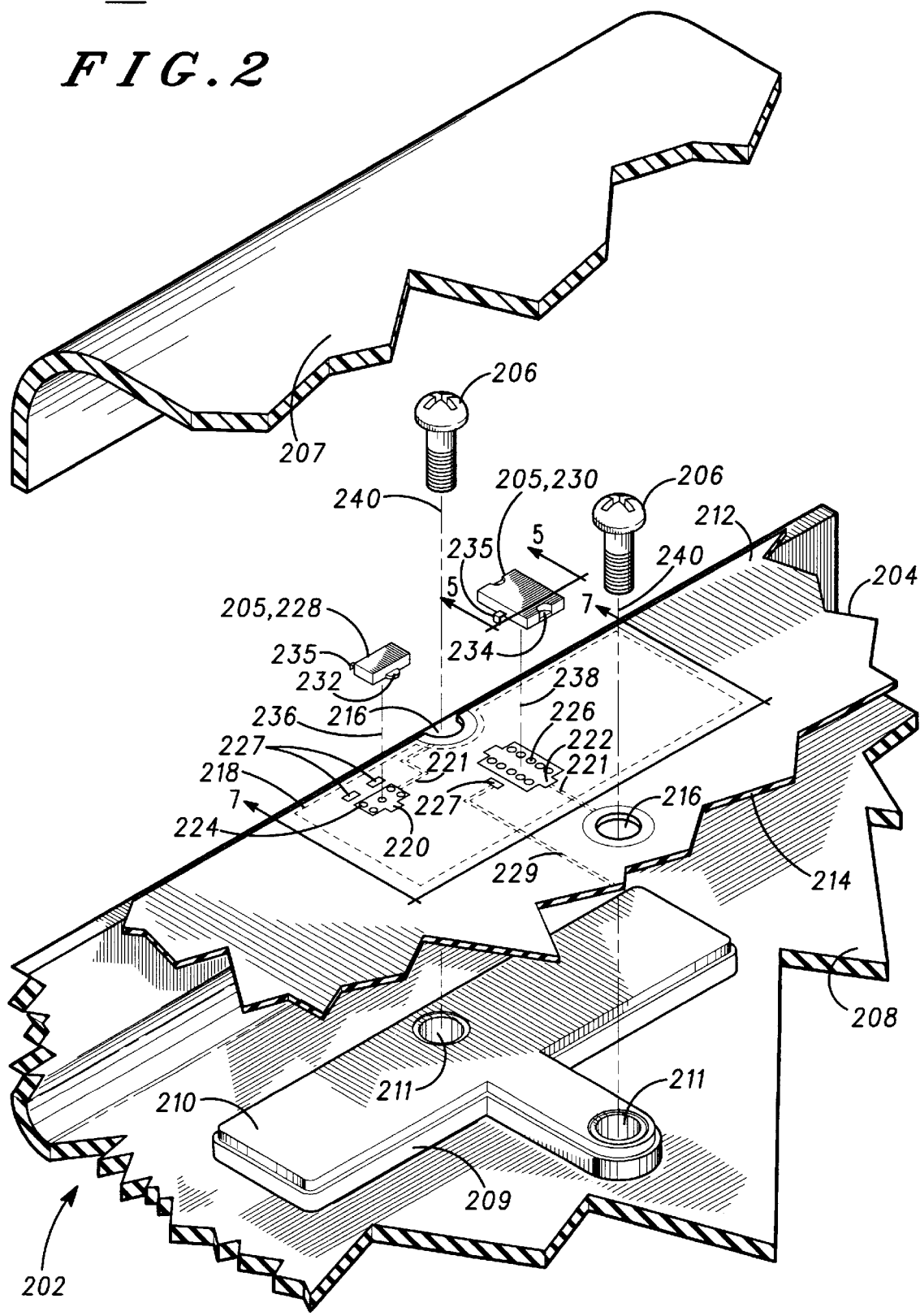
FIG. 2 illustrates a fragmentary exploded perspective view of the circuit board assembly of the transceiver of FIG. 1 showing a top surface of a circuit board employing a heat transfer apparatus.

The power amplifier of the transceiver 108 is contained in a circuit board assembly 200 (FIG. 2) employed by the transceiver 108. The circuit board assembly 200 includes a metal housing 202, a circuit board 204, power amplifier circuitry 205, and metal mounting screws 206, each comprising a head and threaded shaft. The housing 202, of which a portion is shown, is comprised of die-cast aluminum or other material capable of withstanding heat transfer. The housing 202 comprises a top housing portion 207 and a bottom housing portion 208. The bottom housing portion 208 includes an integrally formed, raised platform 209. A top surface of the platform 209 defines a mating surface 210 for directly contacting the circuit board 204. The mating surface 210 is horizontally level thereacross and includes threaded bores 211 sized to receive the threaded shafts of respective ones of the mounting screws 206.

The circuit board 204, of which a portion is shown, is multilayered and comprised of printed circuit board material, such as polyimide, epoxy-based flame retardant industrial fiberglass (G10–FR4), or other suitable alternative. The circuit board 204 is substantially planar thereacross and includes a top surface 212 and a bottom surface 214. Through-holes 216, which are preferably copper-plated, extend through the circuit board 204, between the top surface 212 and the bottom surface 214. Through-holes 216 are sized to permit passage of the shafts, but not the heads, of the mounting screws 206.

The top surface 212 includes a part placement region 218, designated by broken lines. The part placement region 218 includes ground pads 220 and 222 carried on the top surface 212 of the circuit board 204. The ground pads 220 and 222 are dimensioned to receive the power amplifier circuitry 205 and provide electrical grounding therefor. The ground pads 220 and 222 are comprised of clad copper or other suitable material. The ground pads 220 and 222 are coupled to the through-holes 216 via traces 221 disposed within the circuit board 204 and shown in broken line. The ground pads 220 and 222 include vias 224 and 226, respectively. The vias 224 and 226 are cylindrical through-holes that extend through ground pads 220 and 222, respectively, and between the top and bottom surfaces 212 and 214 of the circuit board 204. The vias 224 populating the ground pad 220 are arranged in an X-shaped pattern. The vias 226 are arranged in a pair of rows, wherein each row is positioned parallel to a longitudinal axis, and along opposing edges, of the ground pad 222. In the illustrated embodiment, vias 224 and 226 are dimensioned to have a diameter of approximately 0.7 mm.

The part placement region 218 includes signal pads 227 coupled to traces, such as trace 229, disposed in the circuit board 204 and shown in broken line. The traces deliver signals into the part placement region 218 to be amplified by the power amplifier circuitry 205 and return amplified signals from the power amplifier circuitry 205 to other circuitry (not shown) outside of the part placement region 218.

Figure 3:
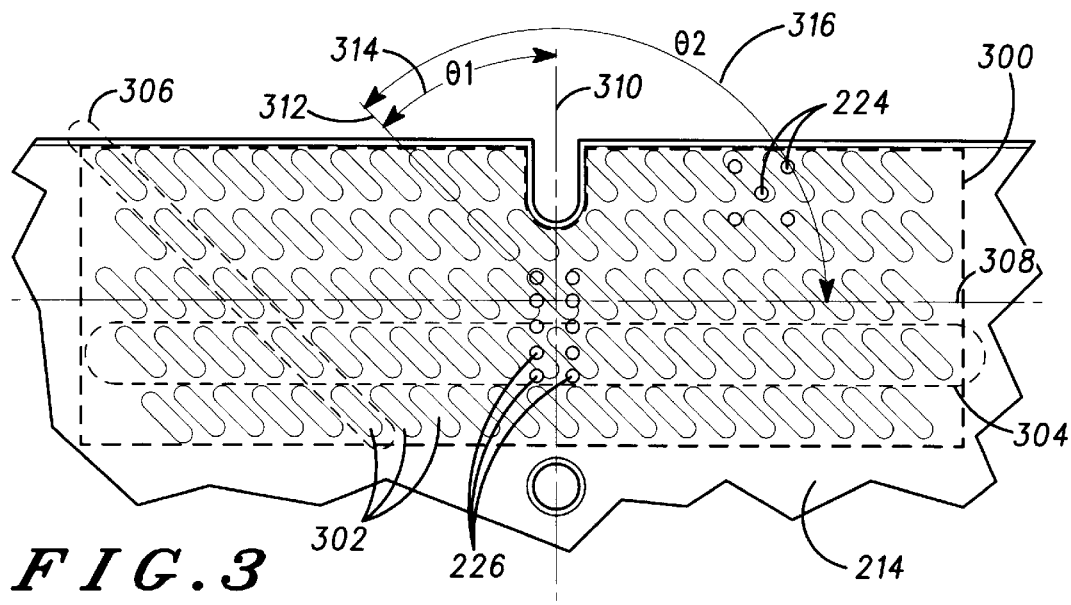
FIG. 3 illustrates a bottom plan view of the circuit board of FIG. 2 containing a pad arrangement employed by the heat transfer apparatus.

The bottom surface 214 of the circuit board 204 includes a heat transfer region 300 (FIG. 3), designated by broken lines. The heat transfer region 300 extends beneath, and is in immediate juxtaposition with, the part placement region 218 (FIG. 2) located on the top surface 212 of the circuit board 204. The part placement region 218 and the heat transfer region 300 (FIG. 3) are similarly dimensioned. The dimension of the heat transfer region 300 substantially corresponds to that of the mating surface 210 (FIG. 2) of the platform 209 of the bottom housing portion 208.

Figure 4:
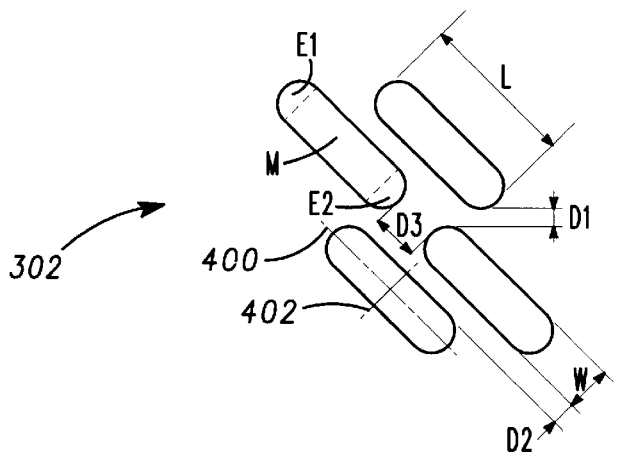
FIG. 4 illustrates an enlarged fragmentary plan view of the pad arrangement of FIG. 3.

The heat transfer region 300 (FIG. 3) is populated by a plurality of pads 302 carried on the bottom surface 214 of the circuit board 204. The plurality of pads 302 are comprised of clad copper or other material capable of bonding to solder. The vias 224 and 226 intersect, and terminate in, the plurality of pads 302. Each of the plurality of pads 302 has an elongated oval shape consisting of a generally rectangular midsection M (FIG. 4) disposed between opposing semicircular ends E1 and E2. Each of the plurality of pads 302, in the illustrated embodiment, includes a length L of approximately 3 mm and a width W of approximately 1 mm. Although the use of elongated oval-shaped pads is preferable for maximum flow of solder flux and maximum solder coverage, it will be recognized that other shapes, such as elliptical, circular, tear drop, cloverleaf, or the like, may alternatively be employed. However, to minimize solder voiding, such pads should employ rounded, rather than angled, corners.

The plurality of pads 302 are arranged in a grid defined by a plurality of rows, such as row 304 (FIG. 3), and a plurality of columns, such as column 306. Each of the plurality of rows is parallel to a longitudinal axis 308 of the heat transfer region 300. Each of the plurality of columns is slanted with respect to the longitudinal axis 308 (FIG. 3) and a transverse axis 310 of the heat transfer region 300. Each of the plurality of columns is parallel to a rotated axis 312 that forms an angle θ1 with the transverse axis 310, as represented by arc 314, and an angle θ2 with the longitudinal axis 308, as represented by arc 316. In the illustrated embodiment, angle θ1 is approximately 45 degrees and angle θ2 is approximately 135 degrees. The rotated axis 312 is parallel to a longitudinal axis 400 (FIG. 4) of each of the plurality of pads 302 and orthogonal to a transverse axis 402 of each of the plurality of pads 302. Although the slanted arrangement of the plurality of pads 302 is preferable for increased solderability due to, for example, correspondence with the angle of the soldering wave of a wave solder process, it will be recognized that other pad arrangement orientations may alternatively be employed.

Spacing between the plurality of pads 302 is uniform through the heat transfer region 300. The plurality of rows are spaced apart by a distance D1, which is approximately 0.5 mm in the illustrated embodiment. Each of the plurality of columns is spaced apart by a distance D2, which is approximately 0.5 mm in the illustrated embodiment. Within each of the plurality of columns, consecutive ones of the plurality of pads 302 are spaced apart by a distance D3, which is approximately 1 mm in the illustrated embodiment. Although the aforementioned pad spacing is preferable because it minimizes solder bridging and maximizes use of the area of the heat transfer region 300, it will be recognized that other pad spacings may alternatively be employed.

The power amplifier circuitry 205 (FIG. 2) includes amplifier components 228 and 230. The amplifier components 228 and 230 are packaged to include ground terminals 232 and 234. Although not shown in FIG. 2, the ground terminals 232 and 234 substantially comprise the footprints of the amplifier components 228 and 230, respectively. Heat generated during operation of the amplifier components 228 and 230 is expelled via the ground terminals 232 and 234, respectively. The amplifier components 228 and 230 also include signal terminals 235 for receiving signals to be amplified and output amplified signals. In the illustrated embodiment, amplifier components 228 and 230 are a RF power MOSFET (metal oxide semiconductor field-effect transistor), part number code BX, commercially available from Hitachi and a RF power MOSFET, part number code AX, commercially available from Hitachi, respectively, or other suitable alternative.

The circuit board assembly 200 is assembled, preferably, via an automated assembly process. The top surface 212 of the circuit board 204 is subjected to either a reflow process or a wave solder process. In the reflow process, a predetermined amount of solder paste is deposited, via screening, on the ground pads 220 and 222 and signal pads 227 of the part placement region 218. The predetermined amount of solder deposited on the ground pads 220 and 222 must be sufficient to attach respective ones of the amplifier components 228 and 230 and fill the vias 224 and 226. The solder paste is a tin-lead-silver alloy solder paste or a suitable alternative. The ground terminals 232 and 234 of the amplifier components 228 and 230, respectively, are positioned into engagement with the solder paste on the ground pads 220 and 222, respectively, as represented by respective ones of lines 236 and 238. The signal terminals 235 of the amplifier components 228 and 230 engage the solder paste on corresponding ones of the signal pads 227. Such placement is preferably performed by an automated part placement machine. The part placement region 218 is then subjected to reflow heating in order to melt the solder paste and adhere the ground and signal terminals 232, 234, and 235 to the ground and signal pads 220, 222, and 227. The melted solder paste from the ground pads 220 and 222 also flows into, and fills, the vias 224 and 226, respectively. Upon cooling, the solder electrically and physically connects amplifier components 228 and 230 to the respective ones of the ground pads 220 and 222 and signal pads 227, and occupies the vias 224 and 226.

In the wave solder process, an epoxy is applied to the part placement region 218. The amplifier components 228 and 230 are positioned into engagement with the ground pads 220 and 222 and held in place by the epoxy. The part placement region 218 is then subjected to a curing process, a flux application, and a molten wave of solder that deposits solder on the ground pads 220 and 222 and the signal pads 227, and in the vias 224 and 226. Upon cooling, the solder electrically and physically connects amplifier components 228 and 230 to respective ones of the ground pads 220 and 222 and signal pads 227, and occupies the vias 224 and 226.

Next, the circuit board 204 is inverted and the heat transfer region 300 (FIG. 3) on the bottom surface 214 is subjected to the wave solder process or the reflow process, as previously described. In the illustrated embodiment, the heat transfer region 300 is preferably subjected to a flux application and soldering wave to deposit solder on the plurality of pads 302. Alternatively, the heat transfer region 300 can be reflow heated to melt a predetermined amount of solder paste screened on the plurality of pads 302. Upon cooling, the solder on each of the plurality of pads 302 forms a substantially uniform, convex solder fillet.

The circuit board 204 (FIG. 2) is then mounted in the bottom housing portion 208 of the metal housing 202 such that the heat transfer region 300 (FIG. 3) is juxtaposed with the mating surface 210 of the platform 209 and the circuit board 204 is horizontally level. To ensure tight contact between the plurality of pads 302 and the mating surface 210, the circuit board 204 is secured to the platform 209 by driving the mounting screws 206 through corresponding through-holes 216 and into corresponding threaded bores 211, as represented by lines 240. The mounting screws 206 are preferably applied by an automated screw machine. Assembly of the circuit board assembly 200 is completed by attaching the top housing portion 207 to the bottom housing portion 208 using a known means of attachment.

Figure 5:
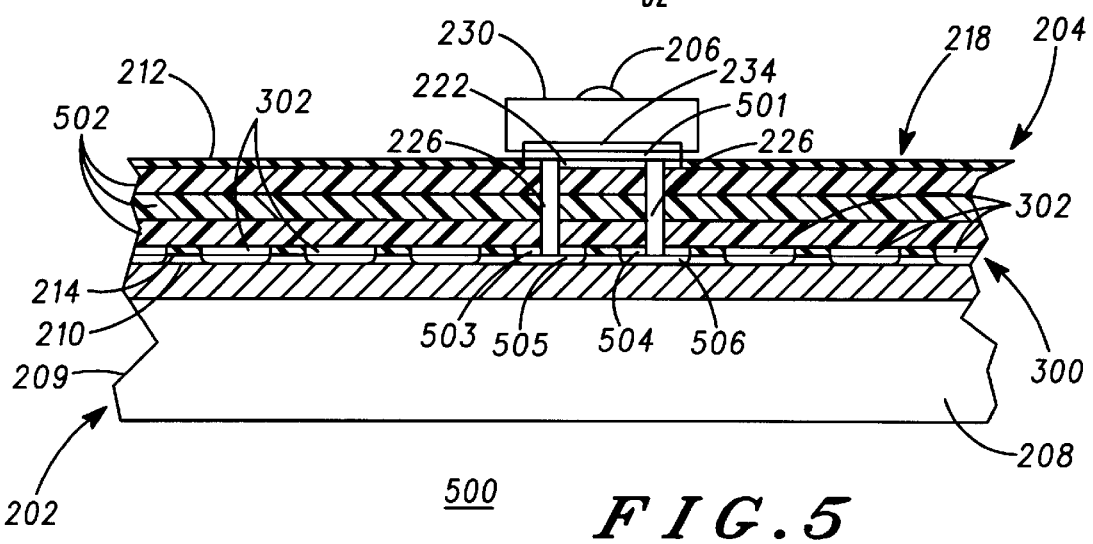
FIG. 5 illustrates an enlarged fragmentary cross-sectional view of the circuit board assembly taken across section lines 5—5 of FIG. 2.

A portion 500 of the assembled circuit board assembly 200 is shown in FIG. 5 with respect to the amplifier component 230. The ground terminal 234 of the amplifier component 230 is electrically and physically attached to the ground pad 222 via a solder fillet 501. The vias 226, now filled with solder, extend downward from the solder fillet 501 through the ground pad 222, multiple layers 502 of the circuit board 204, and respective pads 503 and 504 of the plurality of pads 302. The vias 226 terminate at solder fillets 505 and 506 carried on the respective pads 503 and 504. The solder fillets 505 and 506 contact the mating surface 210 of the platform 209 of the bottom housing portion 208. The solder fillets 505 and 506 are exemplary of the solder fillet carried on each of the plurality of pads 302 of the heat transfer region 300.

In operation, the amplifier component 230 of the power amplifier circuitry 205 (FIG. 2) generates heat. The amplifier component 230 (FIG. 5) internally couples the heat to the ground terminal 234. Once at the ground terminal 234, the heat is conducted to the mating surface 210 via a metallic path comprising the solder fillet 501, the ground pad 222, the vias 226, the pads 503 and 504, and the solder fillets 505 and 506. The mating surface 210 prevents local heat accumulation by distributing the heat across all of the plurality of pads 302 via their respective solder fillets while, at the same time, conducting the heat into the housing 202 via the platform 209 so that it can be dissipated by convection. Heat generated during operation of the amplifier component 228 (FIG. 2) is similarly transferred and dissipated via a similar structure, and for purposes of brevity will not be individually described. Thus, unlike existing structures, the aforementioned heat transfer apparatus transfers heat away from electronic components that are directly mounted on a permanent portion of a circuit board.

More or less vias may be employed to transfer heat from the amplifier components 228 and 230 or other components mounted on the circuit board 204. For some electronic components, such as a chip resistor, a single via employed in the aforementioned manner is sufficient for heat transfer. In cases where heat transfer must be increased, additional vias could be employed. The quantity of vias employed is limited only by circuit board design requirements that require running uninterrupted traces through the region occupied by such vias. Heat transfer capacity could also be increased by increasing the area of the heat transfer region 300 and the density of pad coverage therein.

In addition to transferring heat, the aforementioned metallic paths extending between the ground terminals 232 and 234 of the amplifier components 228 and 230, respectively, and the mating surface 210 are unbroken electrical conductors that provide an additional reliable electrical ground connection between the power amplifier circuitry 205 (FIG. 2) and the housing 202. Such a connection supplements the ground connection provided by the through-holes 216, which are electrically coupled to the platform 209 via the metal mounting screws 206, and promotes consistent performance and stability for the operation of the power amplifier circuitry 205. For additional grounding, the quantity of vias employed or the area of the heat transfer region 300 and the density of pad coverage therein could be increased.

Figure 6:
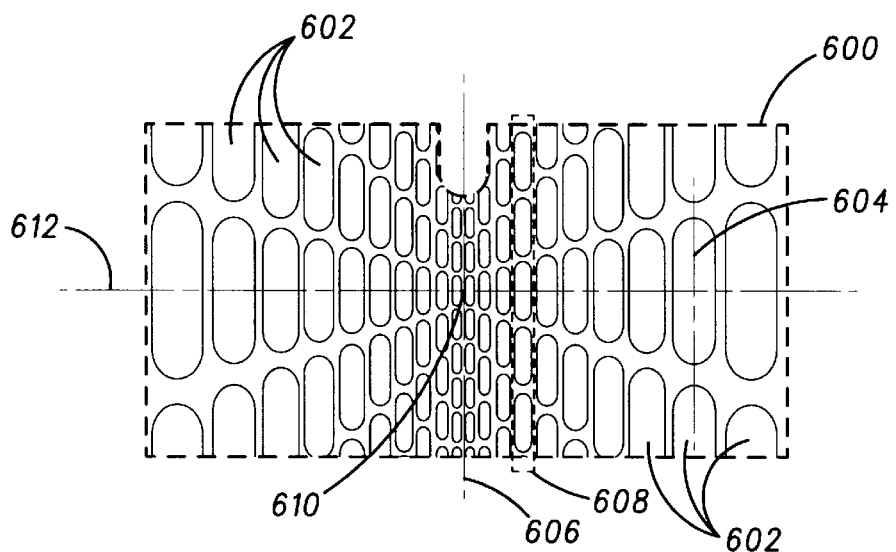
FIG. 6 illustrates a plan view of an alternate pad arrangement employed by the heat transfer apparatus of FIG. 2.

FIG. 6 illustrates an alternate heat transfer region 600 that could alternatively be employed on the bottom surface 214 (FIG. 2) of circuit board 204 opposite the part placement region 218. The alternate heat transfer region 600 (FIG. 6) includes an alternate plurality of pads 602 (FIG. 6). Pads of the alternate plurality of pads 602 are of an elongated oval shape similar to that of the plurality of pads 302 (FIG. 3) and spaced apart in a manner similar to that of the plurality of pads 302. The plurality of pads 602 are arranged so that a longitudinal axis of each, such as longitudinal axis 604, is parallel to a transverse axis 606 of the alternate heat transfer region 600. As such, the alternate plurality of pads 602 form a plurality of columns, such as column 608, which are positioned parallel to the transverse axis 606. The alternate plurality of pads 602 are similarly dimensioned within each of the plurality of columns. However, the dimensions of the alternate plurality of pads 602 vary between columns. In the illustrated embodiment, the arrangement of the alternate plurality of pads 602 is symmetrical about the transverse axis 606. Also, the size or area of the alternate plurality of pads 602 incrementally increases with translation outward from a center 610 of the alternate heat transfer region 600 along a longitudinal axis 612 of the alternate heat transfer region 600.

The alternate heat transfer region 600 is subjected to either the reflow process or the wave solder process, as previously described. A predetermined amount of solder paste is screened on the alternate plurality of pads 602 and reflow heated or solder is applied to the alternate plurality of pads 602 via a soldering wave. Upon cooling, the solder forms a convex solder fillet 700 (FIG. 7) on each of the alternate plurality of pads 602. In the reflow process, a stepped stencil is employed during screening in order to deposit a variable amount of solder paste on the alternate plurality of pads 602 of each column. The stepped stencil is calibrated to deposit sufficient amounts of solder paste on the alternate plurality of pads 602 so that the height of the solder fillets 700 varies among the plurality of columns. In the wave solder process, the height of the resulting fillet is defined by the aperture size of each of the alternate plurality of pads 602. As shown in FIG. 6, the dimensions of the alternate plurality of pads 602 in successive columns are varied in a predetermined manner so that the height of the solder fillets 700 varies among the columns. In the illustrated embodiment, the height of the solder fillets 700 incrementally increase with translation outward from the center 610 (FIG. 6) of the alternate heat transfer region 600 along the longitudinal axis 612 thereof.

Figure 7:
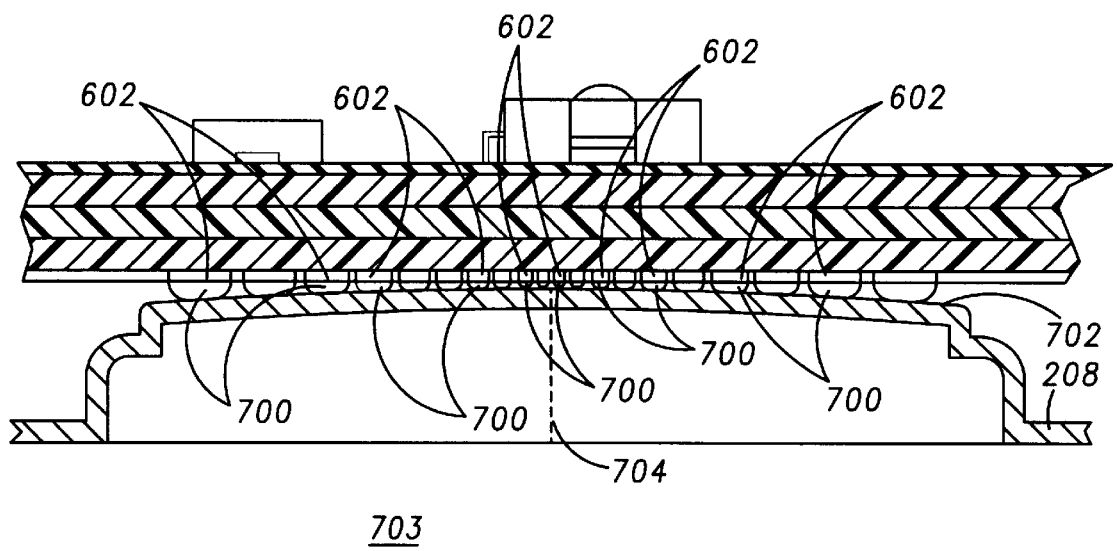
FIG. 7 illustrates a cross-sectional view of an alternate circuit board assembly employing the alternate pad arrangement of FIG. 6 and taken across section lines 7—7 of FIG. 2.

The alternate heat transfer region 600 employed on the circuit board 204 is mated to an alternate mating surface 702 of the platform 209 of the bottom housing portion 208 thereby creating an alternate circuit board assembly 703, of which a portion is shown in FIG. 7. The alternate mating surface 702 symmetrically tapers downward and longitudinally outward from a transverse center plane 704. The varying height of the solder fillets 700 compensates for the curvature of the alternate mating surface 702 to ensure that the circuit board 204 is horizontally level once seated. Also, the varying height of the solder fillets 700 ensures sufficient electrical and physical engagement with the alternate mating surface 702 so as to enable heat transfer using vias as previously described with respect to the aforementioned embodiment. Thus, by varying the dimensions of the pads populating the heat transfer region, the heat transfer apparatus can be employed in circuit board assemblies that employ housings lacking horizontal mating surfaces.

Although shown to be employed in a mobile radiotelephone, it will be recognized that cellular base stations, two-way radio equipment, low-earth orbit satellite communication equipment, computer equipment, stereo equipment, musical equipment, industrial motor controllers, or the like can also benefit from the use of the circuit board assembly employing the heat transfer apparatus, and "device" as used herein shall refer to any such equipment and their equivalents.

Thus it can be seen that heat can be transferred through a circuit board, and a reliable ground path established, by employing an integrated heat transfer apparatus in a circuit board assembly. The heat transfer apparatus permits surface mounting of high heat generating electronic circuits, such as power amplifier circuits, on permanent portions of a circuit board. One or more vias couple heat from the circuits through the circuit board to a grid of pads. The grid of pads disperses the heat to prevent it from locally accumulating and further couples the heat into a metal housing supporting the circuit board for dissipation by convection. Existing assemblies that require a cutaway area of the circuit board to mount functionally similar circuitry directly to a metal housing for heat dissipation can be avoided.

What is claimed is:

1. A heat transfer apparatus carried on a substrate, the substrate having top and bottom surfaces, the heat transfer apparatus comprising:

a part placement region described in the top surface of the substrate, the part placement region being rectangular;

a ground pad carried on the top surface of the substrate and contained in the part placement region, the ground pad to receive an electronic component;

at least one via extending through the ground pad and extending orthogonally between the top and bottom surfaces of the substrate;

a heat transfer region described in the bottom surface of the substrate, the heat transfer region being rectangular, the heat transfer region and the part placement region similarly sized and juxtaposed with one another, the heat transfer region defined by a first longitudinal axis and a first transverse axis orthogonal to the first longitudinal axis; and a plurality of rows of a plurality of ground pads carried on the bottom surface of the substrate and confined to the heat transfer region, each of the plurality of ground pads being an elongated shape and defined by a second longitudinal axis and a second transverse axis orthogonal to the second longitudinal axis, the second longitudinal axis oriented at an angle with respect to the first transverse axis, the angle greater than 0 degrees and less than 90 degrees, the at least one via extending through one of the plurality of ground pads.

2. The heat transfer apparatus according to claim 1 wherein each of the plurality of ground pads are similarly shaped.

3. The heat transfer apparatus according to claim 1 wherein each of the plurality of ground pads are uniformly spaced with respect to one another.

4. The heat transfer apparatus according to claim 1 wherein the angle is approximately 45 degrees.

5. The heat transfer apparatus according to claim 1 wherein each of the plurality of ground pads employ rounded corners.

6. The heat transfer apparatus according to claim 5 wherein each of the plurality of ground pads comprise a rectangular midsection and semicircular ends.

7. A heat transfer apparatus carried on a substrate, the substrate having top and bottom surfaces, the heat transfer apparatus comprising:

a pad carried on the top surface of the substrate to receive an electronic component:

at least one via intersecting the pad and extending between the top and bottom surfaces of the substrate; and a plurality of pads carried on the bottom surface of the substrate beneath the pad, each of the plurality of pads being an elongated oval shape, the at least one via intersecting one of the plurality of pads to transfer heat generated during operation of the electronic component thereto.

8. The heat transfer apparatus according to claim 7 wherein each of the plurality of pads is slanted.

9. A heat transfer apparatus carried on a substrate, the substrate having top and bottom surfaces, the heat transfer apparatus comprising:

a pad carried on the top surface of the substrate to receive an electronic component:

at least one via intersecting the pad and extending between the top and bottom surfaces of the substrate; and a plurality of pads carried on the bottom surface of the substrate beneath the pad, a dimension of the plurality of pads is varied to hold comparatively larger and smaller predetermined amounts of solder extending to comparatively larger and smaller predetermined heights thereabove the at least one via intersecting one of the plurality of pads to transfer heat generated during operation of the electronic component thereto.

10. A circuit board assembly comprising:

a circuit board having top and bottom surfaces;

a part placement region described in the top surface of the circuit board, the part placement region being rectangular;

a heat transfer region described in the bottom surface of the circuit board, the heat transfer region being rectangular, the heat transfer region and the part placement region similarly dimensioned and juxtaposed with one another, the heat transfer region defined by a first longitudinal axis and a first transverse axis orthogonal to the first longitudinal axis;

a ground pad carried on the top surface of the circuit board and contained in the part placement region;

an electronic component coupled to the ground pad via a first solder fillet;

at least one via coupled to the first solder fillet and extending orthogonally between the top and bottom surfaces of the circuit board, the at least one via filled with solder; and a plurality of rows of a plurality of ground pads carried on the bottom surface of the circuit board and confined to the heat transfer region, each of the plurality of ground pads being an elongate shape and defined by a second longitudinal axis and a second transverse axis orthogonal to the second longitudinal axis, the second longitudinal axis oriented at an angle with respect to the first transverse axis, the angle greater than 0 degrees and less than 90 degrees, each of the plurality of ground pads having a second solder fillet carried thereon, the at least one via extending through one of the plurality of ground pads and coupled to the second solder fillet thereof.

11. The circuit board assembly according to claim 10 further comprising a housing adapted to receive the circuit board, the housing including a mating surface for juxtaposition with the heat transfer region to directly contact the second solder fillet of each of the plurality of ground pads.

12. The circuit board assembly according to claim 11 wherein the circuit board is substantially planar, each of the plurality of ground pads is similarly dimensioned, and the mating surface is horizontally level.

13. The circuit board assembly according to claim 12 wherein each of the plurality of ground pads are similarly shaped.

14. The circuit board assembly according to claim 12 wherein each of the plurality of ground pads are uniformly spaced with respect to one another.

15. The circuit board assembly according to claim 12 wherein each of the plurality of ground pads employ rounded corners.

16. The circuit board assembly according to claim 15 wherein each of the plurality of ground pads comprise a rectangular midsection and semicircular ends.

17. A circuit board assembly comprising:

a circuit board having top and bottom surfaces, the circuit board being substantially planar;

a ground pad carried on the top surface of the circuit board;

a part placement region described in the top surface of the circuit board, the part placement region containing the ground pad;

an electronic component coupled to the ground pad via a first solder fillet;

at least one via coupled to the first solder fillet and extending between the top and bottom surfaces of the circuit board, the at least one via filled with solder;

a plurality of pads carried on the bottom surface of the circuit board beneath the ground pad, dimensions of the plurality of pads vary, each of the plurality of pads having a second solder fillet carried thereon, the second solder fillet of at least one of the plurality of pads coupled to the at least one via;

a heat transfer region described in the bottom surface of the circuit board, the heat transfer region populated by the plurality of pads, the heat transfer region and the part placement region similarly dimensioned and juxtaposed with one another; and a housing adapted to receive the circuit board, the housing including a mating surface for juxtaposition with the heat transfer region to directly contact the plurality of pads, the mating surface being curved.

18. A communication device comprising:

an antenna;

a user interface;

a transceiver coupled to the antenna and the user interface, the transceiver to amplify signals received from the user interface for transmission by the antenna, the transceiver comprising a circuit board assembly, the circuit board assembly comprising:

a metal housing having a mating surface;

a circuit board for seating in the metal housing, the circuit board having top and bottom surfaces;

a part placement region described in the top surface of the circuit board;

a heat transfer region described in the bottom surface of the circuit board, the heat transfer region, the part placement region and the mating surface of the metal housing similarly shaped, similarly dimensioned and aligned with one another, the heat transfer region defined by a first longitudinal axis and a first transverse axis orthogonal to the first longitudinal axis;

a ground pad carried on the top surface of the circuit board and contained in the part placement region;

an amplifier circuit positioned in the part placement region, the amplifier circuit having an amplifier component coupled to the ground pad, the amplifier component generating heat at the ground pad during operation thereof;

at least one filled via coupled to the ground pad and extending orthogonally between the top and bottom surfaces of the circuit board; and a plurality of rows of a plurality of ground pads carried on the bottom surface of the circuit board and confined to the heat transfer region, each of the plurality of ground pads being an elongate shape and defined by a second longitudinal axis and a second transverse axis orthogonal to the second longitudinal axis, the second longitudinal axis oriented at an angle with respect to the first transverse axis, the angle greater than 0 degrees and less than 90 degrees, the plurality of ground pads coupled to the mating surface of the metal housing, the at least one via extending through one of the plurality of ground pads, the at least one via delivering heat generated by the amplifier component to the metal housing and the plurality of ground pads for dissipation.

* * * * *